United States Patent [19]
Takahashi et al.

[11] Patent Number: 5,266,877
[45] Date of Patent: Nov. 30, 1993

[54] APPARATUS FOR AND METHOD OF PREPARING NUMERICAL CONTROL DATA FOR INTERACTIVE MOUNTER

[75] Inventors: Shino Takahashi; Hideaki Kobayashi; Yoshinao Arai, all of Yokohama, Japan

[73] Assignee: Hitachi, Ltd., Tokyo, Japan

[21] Appl. No.: 577,604

[22] Filed: Sep. 5, 1990

[30] Foreign Application Priority Data

Sep. 14, 1989 [JP] Japan .................................. 1-237248

[51] Int. Cl.⁵ .............................................. G05D 1/02
[52] U.S. Cl. ................................... 318/571; 318/572; 318/573; 901/47; 364/191; 29/740
[58] Field of Search ................... 318/560-648; 33/621, 618; 414/567, 761, 416, 751, 411, 225, 223; 198/345.1, 689.1, 347.3, 463.4, 464.2; 29/743, 741, 739, 568, 710, 740, 714, 838, 837, 759, 564.6, 564.8; 364/468, 400, 191, 491

[56] References Cited

U.S. PATENT DOCUMENTS

| | | | |
|---|---|---|---|
| 4,685,054 | 8/1987 | Manninen et al. | 364/191 |
| 4,706,187 | 11/1987 | Arai et al. | 364/191 |
| 4,929,940 | 5/1990 | Franaszek et al. | 340/825.02 |
| 4,980,971 | 1/1991 | Bartschat et al. | 29/833 X |
| 5,113,565 | 5/1992 | Cipolla et al. | 29/827 X |

*Primary Examiner*—Paul Ip
*Attorney, Agent, or Firm*—Kenyon & Kenyon

[57] ABSTRACT

In the invention, shapes of an insertion head, a jig and components are indicated to enable updating and new registration, and the relative position between the components and the mounter and the mounting process, the mounting sequence and the collision state of each component are indicated. Thereby input of data is facilitated and error of the data can be easily found. Data required at indicating the collision state indication and the name of the mounter to mount the component and the mounting direction, need not be stored by the user.

20 Claims, 17 Drawing Sheets

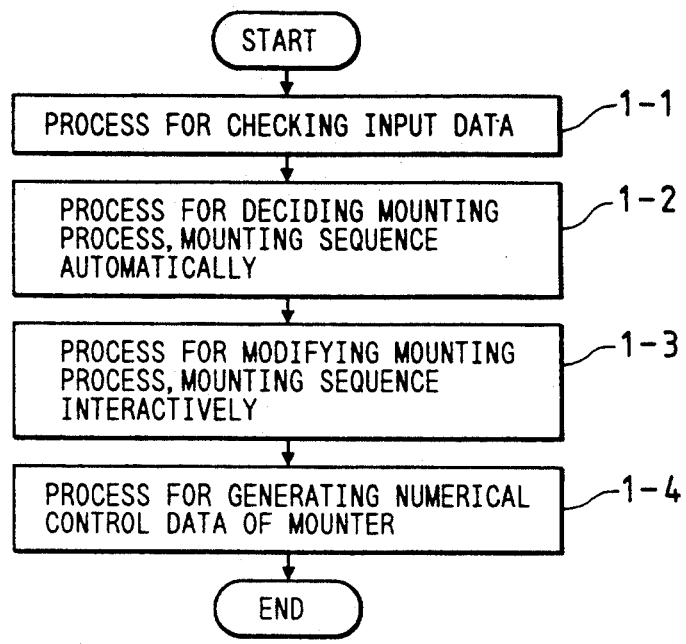
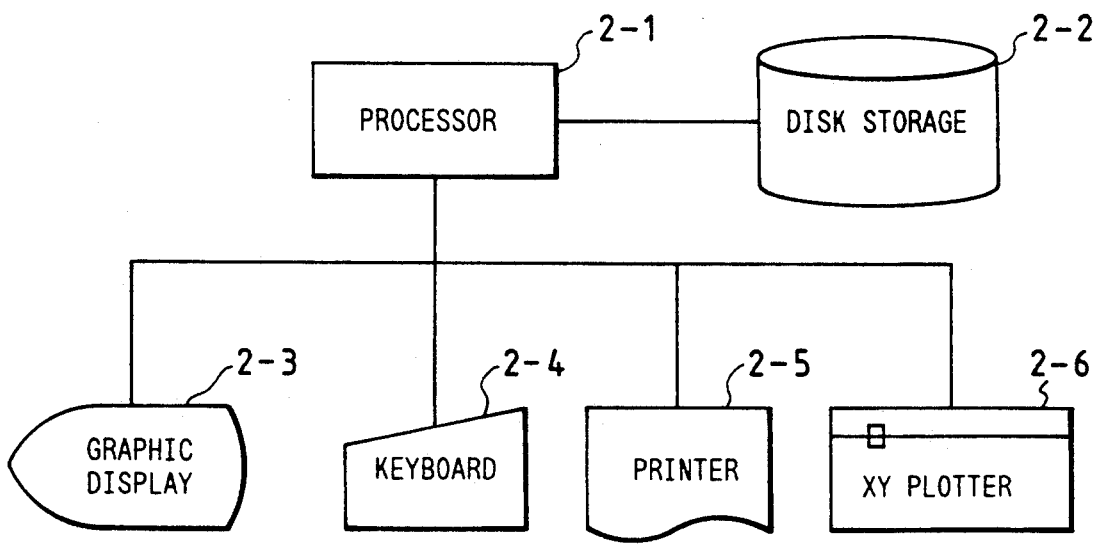

INPUT/DISPLAY SHAPE DATA OF INSERTION HEAD

HEAD NO. = 3          PAGE (1)

SHAPE DATA OF CHUCK          NO. = 2

| NO. | X1(X0) | X2 | Y1(Y0) | Y2 | Z1 | Z2 | R |
|---|---|---|---|---|---|---|---|
| 1 | 200 | -700 | 100 | 0 | 0 | 50 | |
| 2 | 200 | -700 | 100 | -50 | 50 | 100 | |
| 3 | 200 | -700 | 100 | -81 | 100 | 150 | |
| 4 | 200 | -700 | 100 | -97 | 150 | 200 | |
| 5 | 200 | -700 | 100 | -140 | 200 | 250 | |

SHAPE DATA OF PUSHER          NO. = 0

| NO. | X1(X0) | X2 | Y1(Y0) | Y2 | Z1 | Z2 | R |
|---|---|---|---|---|---|---|---|
| 1 | 0 | 0 | 0 | 0 | 0 | 0 | |
| 2 | 0 | 0 | 0 | 0 | 0 | 0 | |
| 3 | 0 | 0 | 0 | 0 | 0 | 0 | |
| 4 | 0 | 0 | 0 | 0 | 0 | 0 | |
| 5 | 0 | 0 | 0 | 0 | 0 | 0 | |

INPUT HEAD NUMBER ( 1~50 )

FIG. 5

| HEAD NUMBER | SHAPE TYPE |
|---|---|
| 3 | 2 |

5-1, 5-2

| SHAPE | X1 (X0) | X2 | Y1 (Y0) | Y2 | Z1 | Z2 | R |
|---|---|---|---|---|---|---|---|
| CUBE 1 | 100 | 0 | 100 | 0 | 0 | 50 | |
| CUBE 2 | 100 | 0 | 120 | 0 | 50 | 100 | |
| CYLINDER 1 | 50 | | 50 | | 0 | 100 | 100 |

5-3

FIG. 7
| | SHAPE TYPE | PARAMETER (P) |
|---|---|---|
| A | 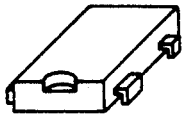 | 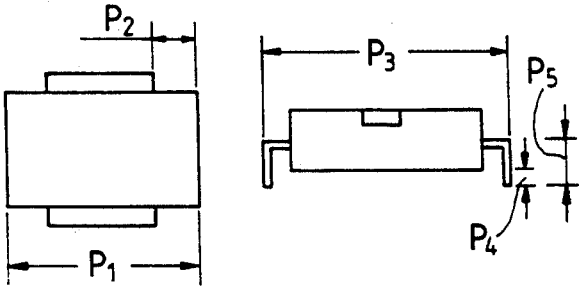 |
| B | 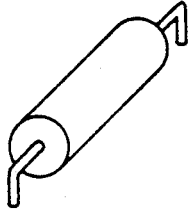 | 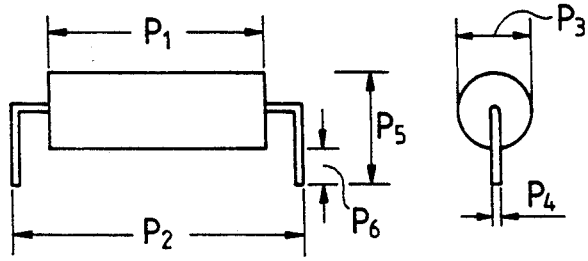 |
| C | 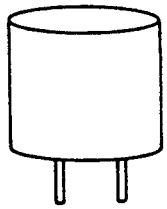 | 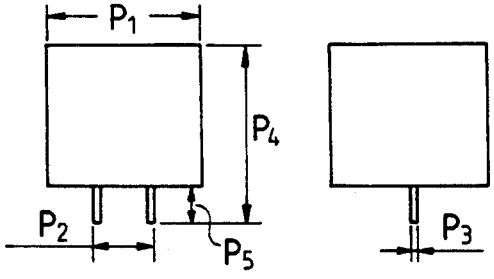 |
| D | 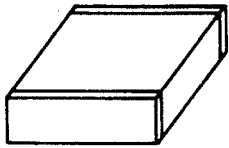 | 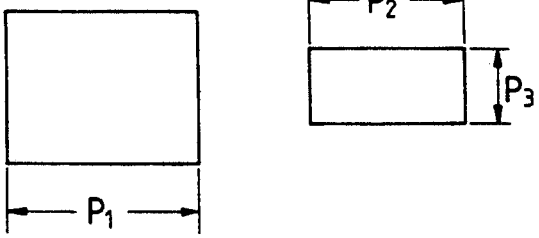 |

FIG. 9

| | | | 9-1 | 9-2 | 9-3 | | | | | | |
|---|---|---|---|---|---|---|---|---|---|---|---|
| PART | PART NUMBER | PART SHAPE TYPE | PARAMETER | | | | | | WIRE DIAMETER | POLARITY |
| | | | 1 | 2 | 3 | 4 | 5 | 6 | | |
| 1 | 1481 | 2 | 770 | 420 | 0 | 0 | 420 | 0 | 80 | 1 |
| 2 | 1637512S | 4 | 0 | 300 | 400 | 0 | 10 | 0 | 0 | 0 |

FIG. 11

SET NO. = AM        PROCESS ORDER INFORMATION NO. = 1

| NAME | |
|---|---|
| BOARD NO. | 285399 |
| PART NUMBER | 100 |
| PREPARATION DATA | 89  01  17 |
| SPECIFICATION NO. | |

| PROCESS | NAME OF MOUNTER | NAME OF HEAD |
|---|---|---|
| 1 | COAXIAL PART MOUNTER | HORIZONTAL HEAD |
| 2 | VERTICAL PART MOUNTER | VERTICAL HEAD |
| 3 | CHIP MOUNTER | CHIP NOZZLE |
| 4 | MANUAL ASSEMBLY | MANUAL ASSEMBLY |
| 5 | | |
| 6 | | |
| 7 | | |
| 8 | | |
| 9 | | |
| 10 | | |

FIG. 16

TABLE OF PROCESS CHANGING COMPONENTS

SET NO. = ASSEMBLE

| ITEM NO. | PART SYMBOL | PROCESS | | ITEM NO. | PART SYMBOL | PROCESS | |
|---|---|---|---|---|---|---|---|
| | | BEFORE CHANGE | AFTER CHANGE | | | BEFORE CHANGE | AFTER CHANGE |
| 1 | C655 | 3 | 5 | | | | |
| 2 | D302 | 2 | 5 | | | | |
| 3 | D712 | 2 | 5 | | | | |
| 4 | D719 | 2 | 5 | | | | |
| 5 | D911 | 2 | 5 | | | | |
| 6 | J 94 | 2 | 5 | | | | |

INPUT PART SYMBOL C655

APPARATUS FOR AND METHOD OF PREPARING NUMERICAL CONTROL DATA FOR INTERACTIVE MOUNTER

BACKGROUND OF THE INVENTION

The present invention relates to an apparatus for, and a method of, preparing numerical control data for interactive mounters where numerical control data for mounters to mount electronic parts automatically onto a printed circuit board are prepared interactively.

In the prior art, numerical control data for mounters are prepared by manual operation in most cases such as disclosed in Japanese patent application laid-open No. 194507/1986, but they may be prepared automatically. To prepare the numerical data automatically, data regarding shape of parts or a head of an insertion machine and the installation position of the parts and the like are stored, and the determination of whether a collision exists or not during part mounting is based on stored data. The numerical control data are thus generated for mounters such that collisions are avoided.

However, even when the numerical control data for mounters are generated automatically, correction, addition, and indication regarding shape of parts or shape of mounters are not considered. As a result, not only is the data input complicated, but also data errors cannot be easily found. Also manual correction or indication of the mounting process and the mounting sequence of each part are not considered. As a result, the determined mounting process and the mounting sequence cannot be easily found and the correction reflecting know-how of the skilled producer of numerical control data cannot be performed. Further, supporting the input of data required during a collision state (the names of parts regarding the collision state indication and the name and the mounting direction of the mounter for mounting the parts) are not considered, thereby all required data must be stored by the user. Moreover, the change of lines for assembling the printed circuit board (arrangement of the mounter) is not considered and as a result, the mounting process and the mounting sequence cannot be determined in lines other than those already determined.

An object of the present invention is to provide an apparatus for preparing numerical control data for mounters, wherein inputting or correcting the shape data of a head of a mounter, a jig, and components is facilitated, and the mounting process, the mounting sequence and the collision state so determined can be easily indicated.

Another object of the present invention is to provide an apparatus for preparing numerical control data for interactive mounters, which can easily accommodate a change in the arrangement sequence of mounters due to change of lines, an apparatus for preparing numerical control data for interactive mounters where data of head shape of a mounter can be simply inputted and whether the inputted data is good or not is determined, an apparatus for preparing numerical control data for interactive mounters where data of the shapes of components can be simply inputted and whether the inputted data is good or not is determined, an apparatus for preparing numerical control data for interactive mounters where components relating to detected collisions and various sorts of treatments for the components are calculated, an apparatus for preparing numerical control data for interactive mounters where whether the determined mounting process is good or not is determined, an apparatus for preparing numerical control data for interactive mounters where the determined mounting process is corrected, an apparatus for preparing numerical control data for interactive mounters where whether the determined mounting sequence is good or not is determined, and an apparatus for preparing numerical control data for interactive mounters where the determined mounting sequence is corrected.

SUMMARY OF THE INVENTION

The above objects can be attained in such a constitution of the present invention in which shapes of a head of a mounter, a jig, and components are indicated to enable the updating and new registration, and the relative position between components and a mounter, the mounting process of each component, the mounting sequence and the collision state can be indicated.

Other object can be attained in constitutions of the present invention in which plural pieces of information in sequence of processes with mounters arranged in sequence of processes for mounting components are stored, and one among the stored information in sequence of processes is externally commanded, and the names of the mounters are indicated in sequence of processes in the commanded information in the process sequence, and the mounting process and the mounting sequence of each component can be calculated when the components are mounted by the commanded information in the process sequence; in which the shape of a head of a mounter is stored as shape type representing feature of the shape and as one or more simple shapes such as a cube or a cylinder set corresponding to each shape type, and these simple shapes are indicated to enable external updating; in which the shapes of components are stored as shape types representing the features of the shapes and as parameter values set corresponding to each shape type, and the shape types and the parameter values representing each shape are indicated to enable external updating; in which the names of components according to a manual process selected as the mounting process for a part of components relating to a collision are indicated based on calculation results from which the collision is produced from the relative position between the components and the mounter and the shape, and one of the components according to the manual process is commanded and the collision state regarding the commanded component is indicated; in which components according to the collision state indication externally commanded, the mounting process to mount the components is commanded from the indicated mounting process to enable the mounting, and when the direction to mount the components is commanded from the mounting direction indicated regarding the commanded mounting process to enable the mounting, the components to produce the collision with the corresponding mounter are calculated and the calculation results are indicated when mounting the components according to the commanded mounting process and the mounting direction; in which components relating to the process are colored corresponding to the mounting process and the whole printed circuit board is indicated as a plane, and a part of the circuit board is shown in an enlarged view; in which the mounting process of the components is reindicated by recalculation based on an updating when the mounting process of the components is updated; in which the mounting sequence of components is indicated in each mounting process; in which the mounting sequence of the components is reindicated by recalculation based on an updating when the mounting sequence of components is externally updated; and in which the mounting sequence and the restriction to avoid a collision are indicated simultaneously in each mounting process of the components.

When the shapes of a head of a mounter, a jig, and components are indicated to enable new registration and updating, the shape as input data can be interactively added or corrected. Moreover, when the relative position between the components and the mounter, and the mounting process, the mounting sequence and the collision state of each component are indicated in plane form or solid form, whether the mounting process or the mounting sequence is good or not is easily determined from the mounting process, the mounting sequence and the collision state determined and indicated.

When the line (arrangement of the mounter) is stored as the process order information, in response to change of the line, the mounting process and the mounting sequence of each component can be calculated and the change of the arrangement order of the mounter due to the change of the line can be easily accommodated.

When the head shape of the mounter is stored as a shape type representing features of the shape and as one or more simple shapes such as a cube or a cylinder set corresponding to each shape type, and these simple shapes are indicated to enable external updating or the part shape is stored as the shape type representing feature of the shape and as the parameter value set corresponding to each shape type, and the shape type and the parameter value representing these shapes are indicated to enable external updating, the input data required for the indication are limited thereby the shape date can be simply inputted and whether the inputted data is good or not can be easily determined.

When the combination will produce a collision from the relative position between the components and the mounter and the shape, the manual process is selected as the mounting process for a part of the components relating to the collision or the name indication of the component or the collision state indication regarding the component is performed, and as a result selecting or the indicating the component relating to the collision becomes easy. Further, when the mounting process regarding the component relating to the collision state indication externally commanded or the mounting direction in this mounting process is commanded, and the component to produce the collision with the corresponding mounter is calculated and the calculation result is indicated, the mounting process or the mounting sequence is changed even if the calculation is performed as the component relating to the collision, and as a result the automatic mounting becomes possible.

When the component relating to the process is colored corresponding to the mounting process and the whole printed circuit board is indicated as a plane and a view of a part of the board is enlarged whether the determined process is good or not is easily determined.

When the mounting process is reindicated by the recalculation based on an updating, the correcting the mounting process can be performed easily.

When the mounting sequence of the components is indicated in each mounting process, whether the mounting sequence is good or not is easily determined.

When the mounting sequence of the components is reindicated by the recalculation based on the command of the updating, and further in this connection, the mounting sequence and the restriction to avoid the collision are simultaneously indicated in each mounting process of the component, the determined mounting sequence can be easily corrected in this time.

BRIEF DESCRIPTION OF THE DRAWINGS

FIG. 1 is a diagram showing a schematic flow of processing in an apparatus for preparing numerical control data for interactive mounters according to the present invention;

FIG. 2 is a schematic diagram showing an example of an apparatus for preparing numerical control data for interactive control data for interactive mounters according to the present invention;

FIG. 5 is a diagram showing an example of a registered data when shape data of an insertion head is registered;

FIG. 7 is a diagram showing an example of shape type and parameter of various components;

FIG. 9 is a diagram showing an example of a registered data format when shape data of components is registered;

FIG. 11 is a diagram showing an example of a frame when input of numbers of a circuit board and process order information is performed;

FIG. 16 is a diagram showing an example of a frame of "table of process changing components" regarding components with the mounting process changed from automatic mounting to manual process;

DETAILED DESCRIPTION OF PREFERRED EMBODIMENTS

Figure 3:
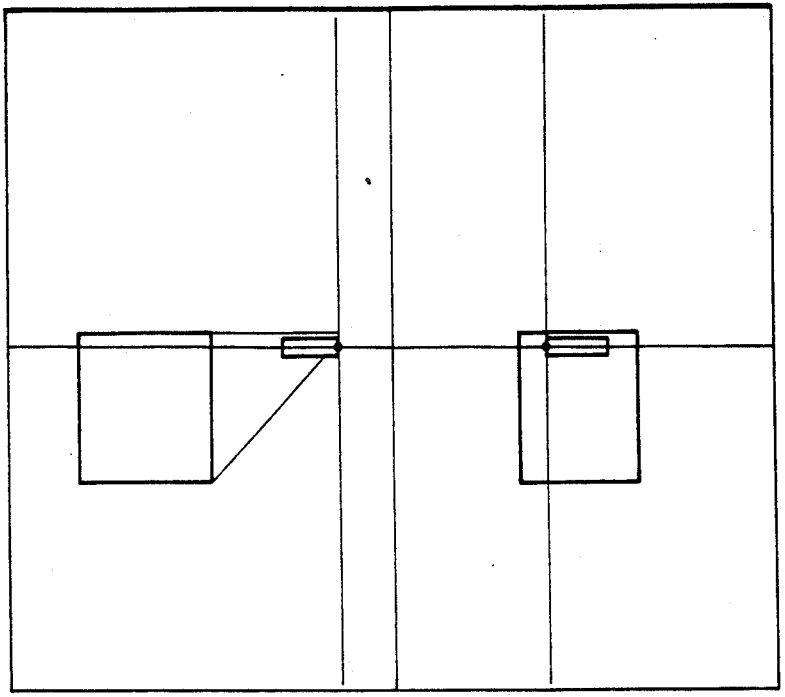
FIG. 3 is a diagram showing an example of a frame of "input/display of shape data of an insertion head" when input, indication, correction and reindication of shape data of an insertion head are performed interactively.

The present invention will now be described referring to FIGS. 1 through 18.

First, an outline of processing performed in an apparatus for preparing numerical control data for interactive mounters according to the present invention will be described as follows.

FIG. 1 shows a schematic flow of the processing. Referring to FIG. 1, the processing can be broadly classified into four parts. That is, process 1-1 for checking input data, process 1-2 for automatically determining the mounting process and the mounting sequence, process 1-3 for interactively modifying the mounting process and the mounting sequence, and process 1-4 for generating numerical control data used by a mounter, are performed in sequence, thereby generating the numerical control data for the mounter. In the process 1-1 for checking input data, data required to generate numerical data used by the mounter such as: the shape data of an insertion head; the shape data of components; or the mounting position data of components previously stored in a memory, are displayed on the display frame and checked. These data are modified by the user and new data are added thereto. In the process 1-2 for automatically deciding the mounting process and the mounting sequence, the mounting process and the mounting sequence of each component on the circuit board are automatically determined based on the input data processed in the process 1-1 for checking input data. Also, in the process 1-3 for modifying the mounting process and the mounting sequence interactively, once determined, the mounting process and the mounting sequence of each component are displayed on the display frame. The user then modifies and adds mounting processes and mounting sequences. In the last process 1-4 for generating numerical control data to be used by the mounter, in accordance with the mounting process and the mounting sequence of each component determined in the previous processes 1-2, 1-3, the numerical control data of the mounter is generated for each mounter corresponding to each process. In principle, the processing is performed in sequence as above described, thereby the numerical control data of the mounter is generated. However, after the process 1-3 for interactively modifying the mounting process and the mounting sequence, the operation may be returned to the process 1-1 for checking the input data.

FIG. 2 schematically shows an example of an apparatus for preparing numerical control data to be used by interactive mounters according to the present invention. As shown in FIG. 2, a disk 2-2 provided as a data storage means, a graphic display terminal 2-3 provided as a display means, a keyboard 2-4 provided as an external data input and command means, a printer 2-5 provided as an auxiliary output device and an XY plotter 2-6, are all controlled by a processor 2-1. The processor 2-1 is constituted to include various indication means and operation means for deciding the mounting process and the mounting sequence. The disk storage 2-2 can input/output various data through the control device with a CAD system provided as an external device.

An Outline of the processing according to the present invention and an outline of the constitution of the apparatus for preparing numerical control data for interactive mounters according to the present invention have veen described, and each of the four processes will be described in detail as follows.

First, the process for checking input data will be described. FIG. 3 illustrates an example of a frame of "input/display of shape data of the insertion head". Referring to FIG. 3, if the head number is selected from the keyboard, the registered head shape corresponding to the head number is displayed as plane surface or side surface on the display frame, and in accordance with any instructions input from the keyboard, the head shape is modified or the new head shape is registered. In the example illustrated in FIG. 3, the input data is a cylinder or a cube corresponding to the shape type of the insertion head, and is really inputted as shape data. A chuck portion and a pusher portion constituting the insertion head can each be registered separately.

Figure 4:
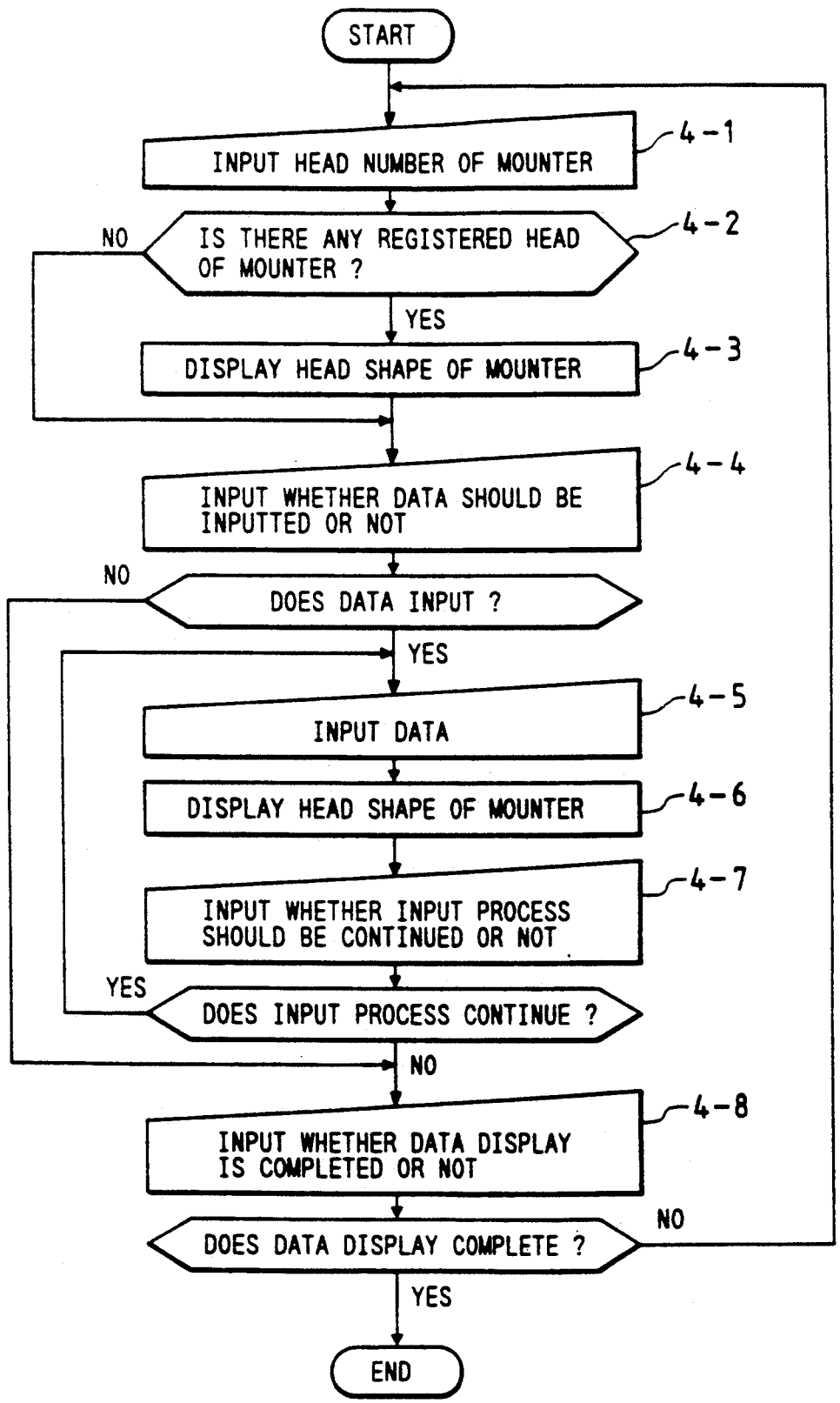
FIG. 4 is a flow diagram showing processing in the frame of "input/display of shape data of an insertion head" shown in FIG. 3.

FIG. 4 shows the flow of processing in a frame of "input/display of shape data of an insertion head" shown in FIG. 3. Referring to FIG. 4, if the number of the insertion head to be displayed or inputted to the frame is inputted from the keyboard in the process 4-1, whether the insertion head has been registered or not is determined in process 4-2. If the insertion head has been registered, the shape of the insertion head is displayed in the process 4-3, and then whether the data input for the modifying the shape of the insertion head should be performed or not is inputted in the process 4-4. If the insertion head has not yet been registered, whether the data input for the new registration should be performed or not is inputted in the process 4-4. Then whether the data should be inputted or not is determined. If the data is not inputted, the processing is transferred to the process 4-8. If on the other hand, the data is inputted, the data is inputted from the keyboard in the processes 4-5, 4-6, and the modified or new insertion head shape is displayed on the frame. Then whether the input process should be further continued or not is inputted from the keyboard in the process 4-7. If the input process is not continued (i.e., completed), the processing is transferred to the process 4-8, while if the process is continued (i.e., not completed), the processing is transferred to the process 4-5. When the data input is repeated, the desired shape of the insertion head can be easily obtained and the new registration becomes possible. When the data processing is transferred to the process 4-8, whether the data display should be completed or not is inputted from the keyboard. If the data display is not completed, the processing is returned to the process 4-1. However if the data is completed, the series of the processing the shape of the insertion head is completed.

FIG. 5 illustrates an example of a registered data format when the shape data of an insertion head are registed. As shown in FIG. 5, corresponding to the shape data of the insertion head, the shape of the insertion head is uniquely specified from the head number 5-1 as the registered head consecutive number, the shape type number 5-2 and the shape data 5-3. In this case, the shape type indicates that the chuck and the pusher constituting the insertion head can be represented by the overlaying of cubes or the overlaying of cylinders or the overlapping of two cubes arranged in parallel in the lateral direction. Also the shape data 5-3 includes various data such as X-axis directions X1, X2, Y-axis directions Y1, Y2, Z-axis directions Z1, Z2 regarding a cube or a cylinder or the center Xo, Yo, Z-axis directions Z1, Z2, radius R of a circle.

Figure 6:
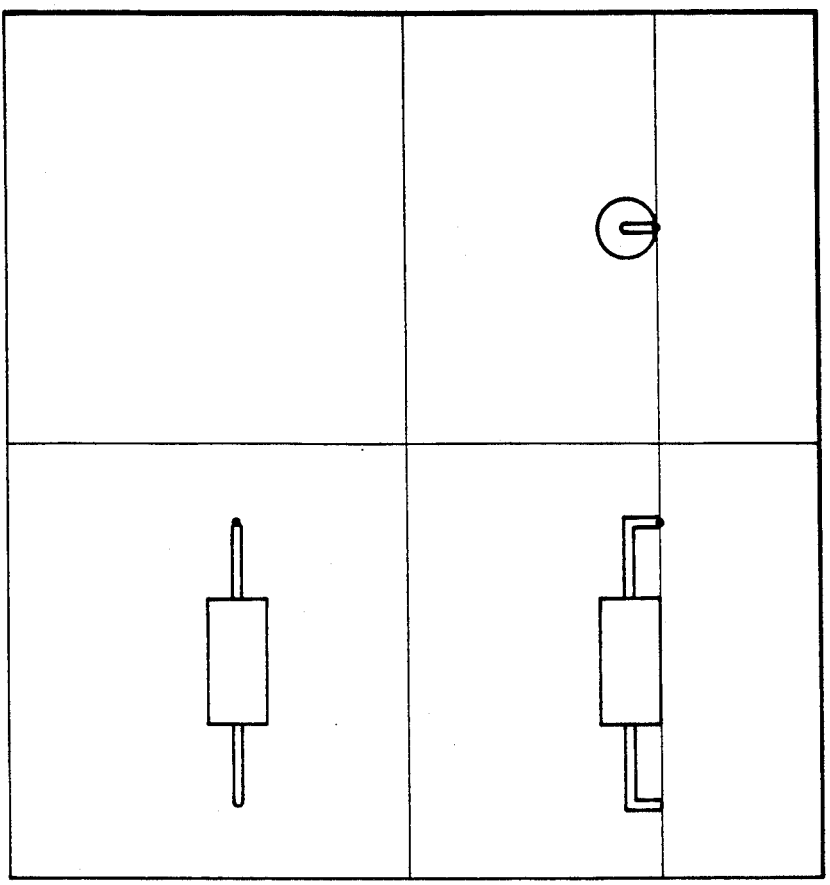
FIG. 6 is a diagram showing a frame of "input/display of part data" when indication, input, correction and reindication of shape data of components are performed interactively.

FIG. 6 shows a frame of "input/display of part data" from which the part shape may be interactively indicated, input, modified or reindicated. The part number is selected from the keyboard, and the registered part shape corresponding to the part number is then displayed as a plane surface, a front surface and a side surface onto the frame. In accordance with any commands from the keyboard, the part shape may be modified or newly registered. The shape type representing feature of the shape, the parameter value specified corresponding to the shape type and the like are inputted, and the part shape can be modified or newly generated.

FIG. 7 illustrates examples of various shape types of components and the parameter values. Among these, class A shows the shape type representing the shape of IC or the like and its associated parameter values, class B shows the shape type representing the shape of the axial component, such as diode, and its associated parameter values, class C shows the shape type representing the shape of a capacitor or the like and the parameter values, and class D shows the shape type representing the shape of a rectangular chip component and its associated parameter values, respectively. If the shape type and its associated parameter $P_1$-$P_6$ are specified, the shape and size of the component is substantially established. For example, to specify the shape of the axial component, six parameters are required, but in the case of the rectangular chip component, only three parameters are required.

Figure 8:
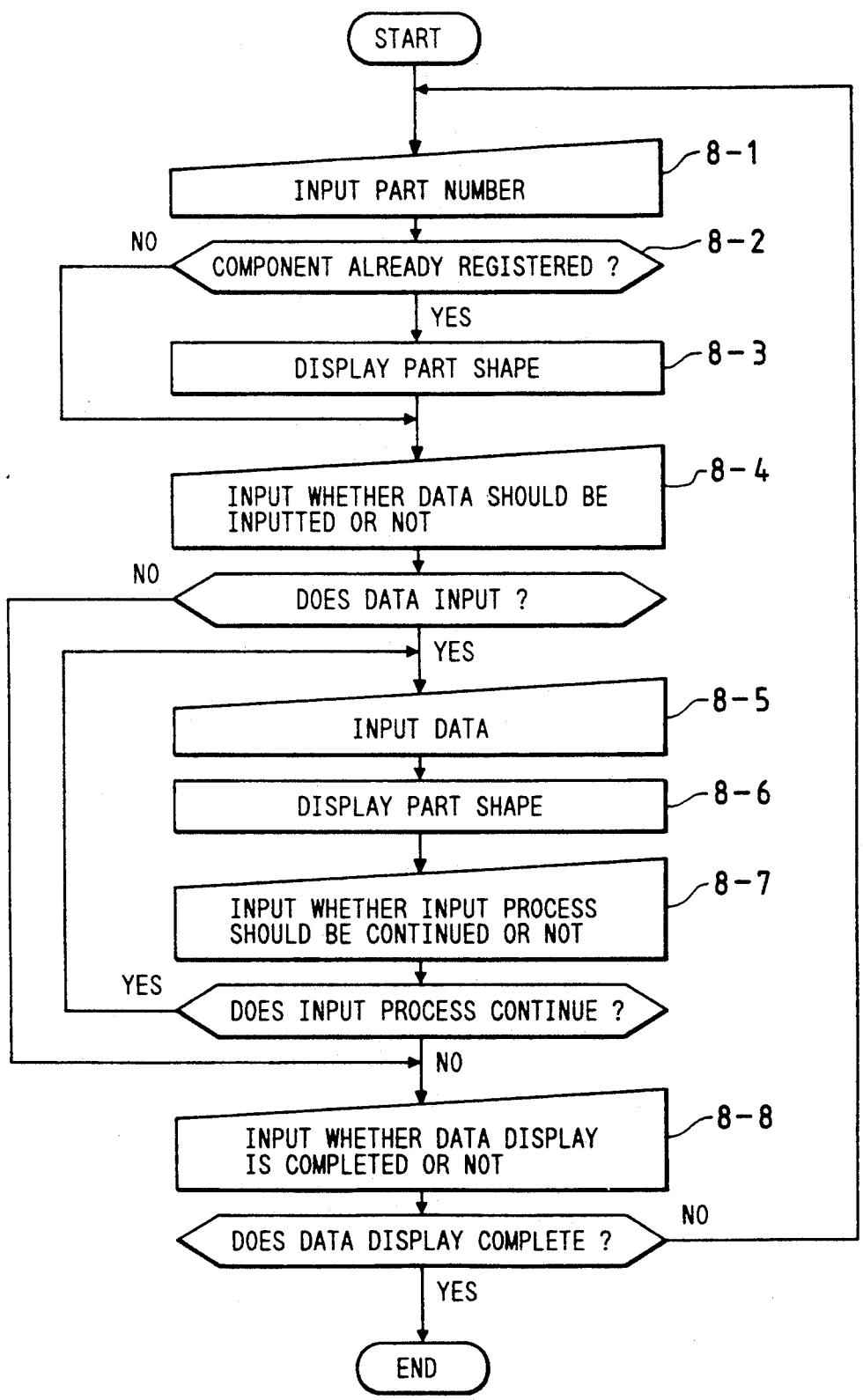
FIG. 8 is a flow diagram showing the frame of "input/display of part data" shown in FIG. 6.

FIG. 8 shows the processing flow in a frame of "input/display of part data" as shown in FIG. 6. Referring to FIG. 8, if the part number of the component to be displayed or inputted onto the frame-is inputted from the keyboard in the process 8-1, whether the component corresponding to the number has been registered or not is determined in process 8-2. If the component has been registered, the part shape is displayed in the process 8-3, and then whether the data for modifying should be input or not is inputted in the process 8-4. If the component has not yet been registered, whether the data for the new registration should be performed or not is inputted in the process 8-4. Next, whether the data is inputted or not is determined. If the data is not inputted, the processing is transferred to the process 8-8. If however, the data is inputted, the data is inputted from the keyboard in the processes 8-5, 8-6, thereby the modified or new part shape is displayed onto the frame. Then whether the input process should be further continued or not is inputted from the keyboard in the process 8-7. If the input process is not continued (i.e., completed), the processing is transferred to the process 4-8, while if the input process is continued (i.e., not completed), the processing is transferred to the process 8-5. When the data input is repeated, the desired shape of the component can be easily obtained, and new registration becomes possible. When the processing is transferred to the process 8-8, whether the data display should be completed or not is inputted from the keyboard. If the data display is not completed, the processing is returned to the process 8-1 again, while if the data display is completed, this series of processing is complete.

FIG. 9 shows an example of a registered data format when shape data of components are registered. As shown in FIG. 9, the shape data are constituted by the part number 9-1, the part shape type 9-2, and the parameter values (wire diameter and the polarity are also registered if necessary) 9-3 so as to specify the part shape.

The process for checking the input data has been described, and the process for deciding the mounting process and the mounting sequence automatically will now be described as follows.

Figure 10:
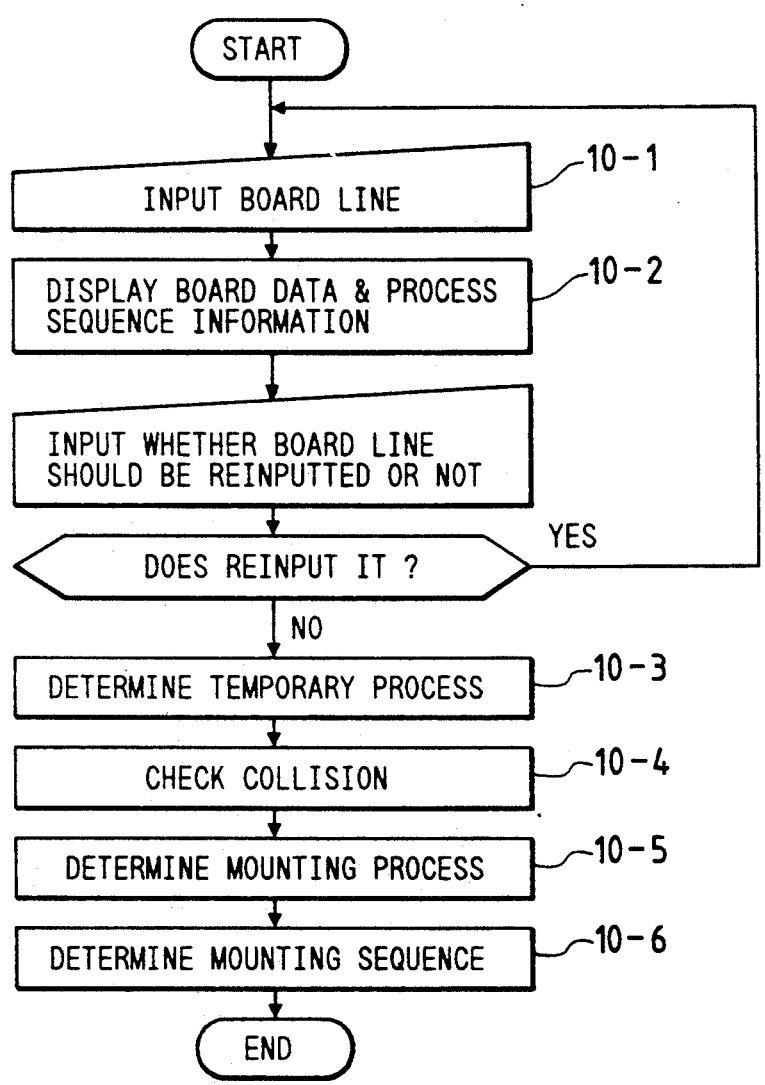
FIG. 10 is a flow diagram showing processing of automatically determining the mounting process and the mounting sequence according to the present invention.
Figure 12A:
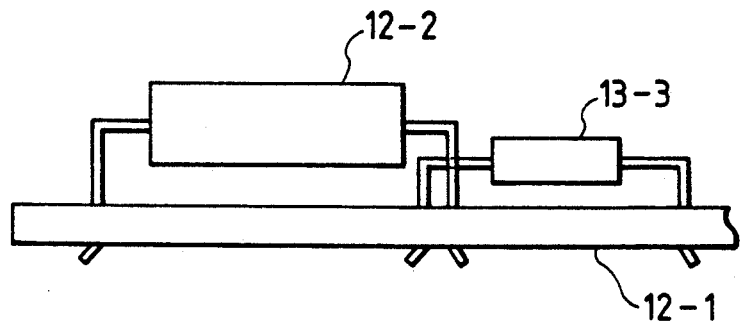
FIGS. 12(a)-(c) are diagrams showing examples of various collisions.
Figure 12B:
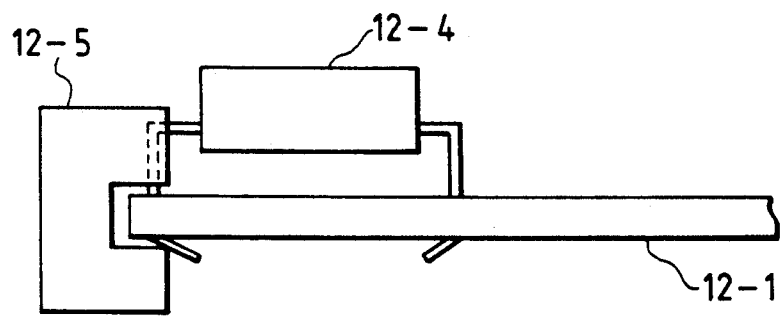
Figure 12C:
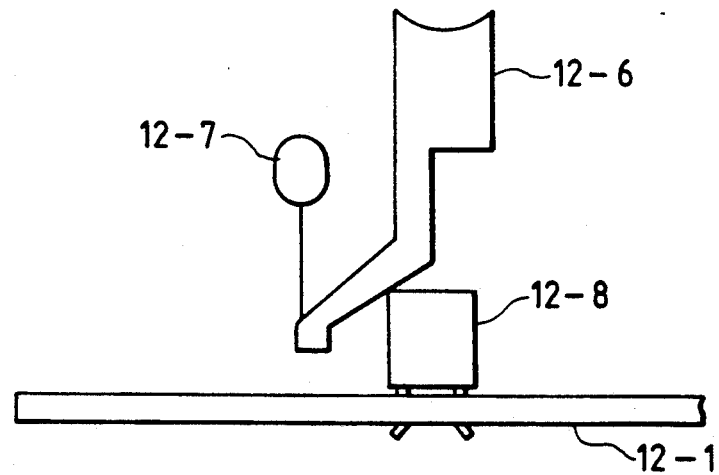

FIG. 10 shows a flow of the process for deciding the mounting process and the mounting sequence automatically. Referring to FIG. 10, first, a circuit board on which components are to be mounted and the process order information number representing lines to assemble the board (arrangement of the mounter) are selected by the user in the process 10-1. FIG. 11 shows an example of a frame where the circuit board and the process order information number are inputted. If the board proper number and the process order information number are key-inputted by the user in the process 10-2, data regarding the registered substrate (the part number or the like) and the name of the mounter and the name of the insertion head in sequence of the process in the corresponding process order information are indicated. After the circuit board and the lines are confirmed based on the indication, starting the process for deciding the mounting process and the mounting sequence automatically or reinputting the circuit board and the process order information number is selected. When the process for deciding the mounting process and the mounting sequence automatically is selected, first, the component is temporarily allocated to the process of the automatic mounter which can mount, i.e., hold, the component in the process 10-3. Based on the temporary decision, the collision produced when mounting each component is calculated entirely from the shape of the components and the insertion head and the relative position between these in the process 10-4. FIGS. 12(a)(c) show various collisions. FIG. 12(a) shows the collision between the component 12-2 and the component 13-3, FIG. 12(b) shows the collision between the component 12-4 and the jig 12-5, and FIG. 12(c) shows the collision between the insertion head 12-6 and the component 12-8. After the collision is checked in the process 10-4, the component capable of not avoiding the collision in the automatic mounting is subjected to the process changing into the manual process, and the final mounting process is determined in the process 10-5. And then the mounting sequence of the components is determined in each mounting process in the process 10-6.

Figure 13:
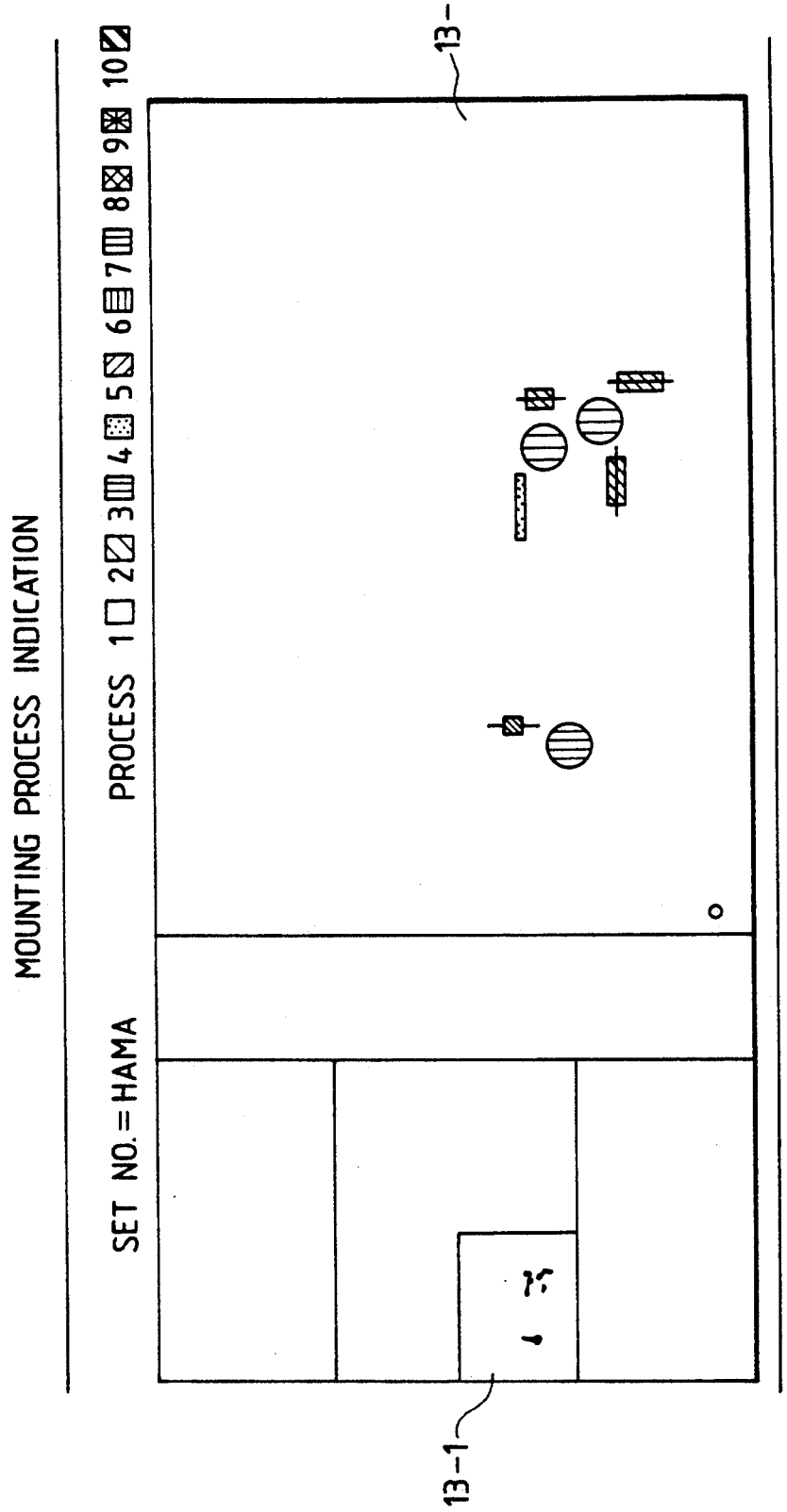
FIG. 13 is a diagram showing an example of a frame of "mounting process indication"
Figure 14:
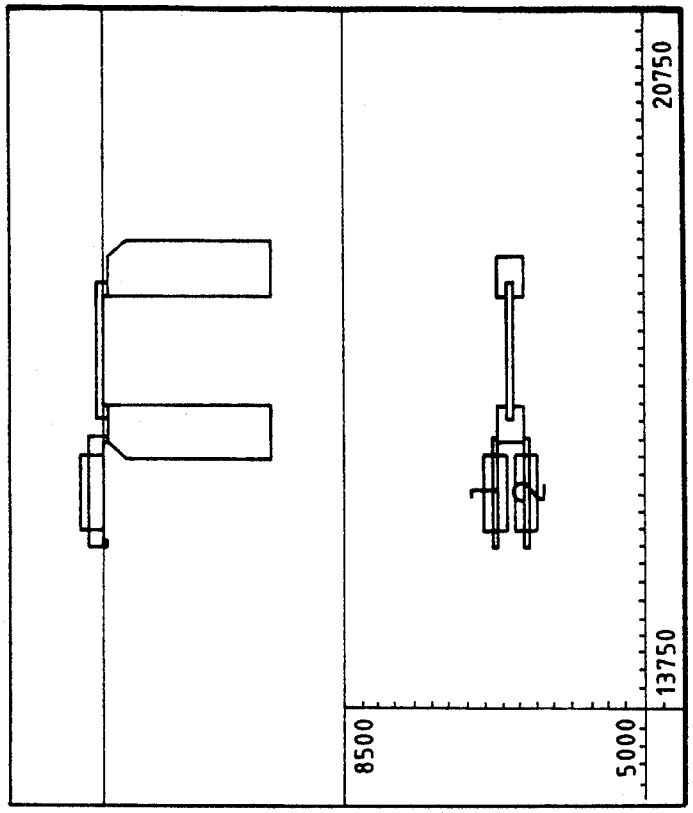
FIG. 14 is a diagram showing an example of a frame of "collision state indication"

The process for deciding the mounting process and the mounting sequence automatically has been described, and the process for interactively modifying the mounting process and the mounting sequence determined in this manner will now be described. FIG. 13 illustrates a frame of "mounting process indication". In this frame, the determined mounting process is displayed, but the coloring is different in each determined mounting process and components mounted onto the circuit board are all displayed as a plane surface. The shape of the component is expressed by combinations of circles and rectangles in accordance with the input data, but since the components are colored and indicated with color corresponding to the manufacturing process, not only the component changed to the manual process can be discriminated at a glance but also the state at its circumference can be easily known. When the further detailed indication is required, the enlargement command is key-inputted thereby a part of the display frame is displayed with enlargement. The frame 13-2 illustrated in FIG. 13 is the enlarged indication of the frame 13-1. Further if necessary, the displayed component is assigned by the cursor and then the mounting process is inputted, or the part symbol and the mounting process are inputted, thereby the mounting process regarding the component can be modified. When a collision is produced as a result of the modifying, classification of the collision as the alarm message is displayed, and the state with the insertion head can be also displayed as the state of the collision. FIG. 14 illustrates a frame of "collision state indication" where the state is indicated. Such frame of "collision state indication" is obtained by the process of displaying the collision state.

Figure 15:
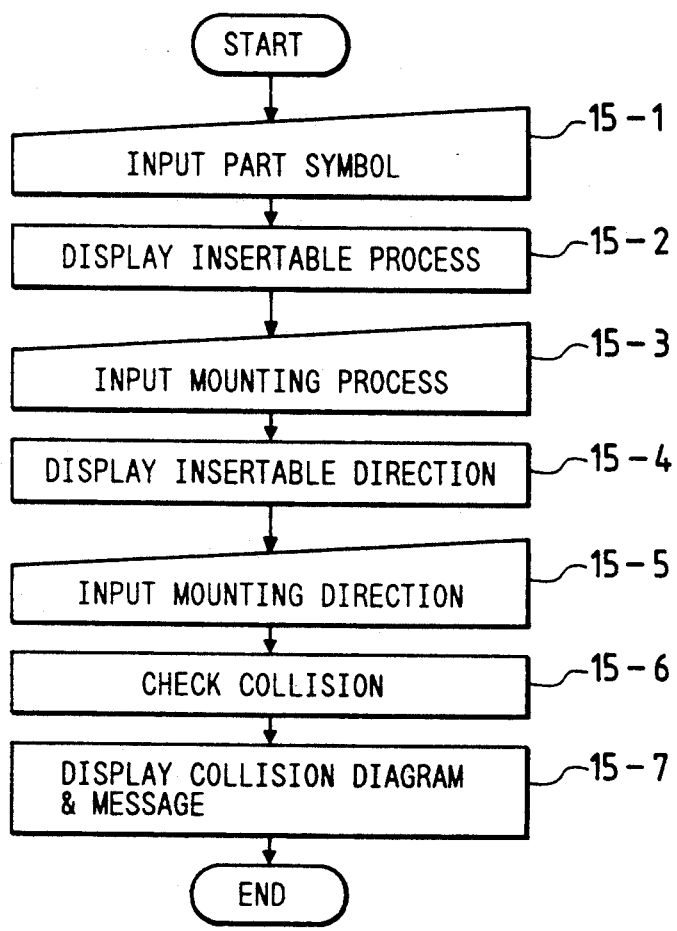
FIG. 15 is a flow diagram showing processing of indicating the collision state.

As shown in FIG. 15, to indicate a collision state, the part symbol (proper symbol is provided even to components of the same sort so as to discriminate the components on the circuit board) is inputted and assigned in the process 15-1. If the part symbol is assigned, the insertable mounting process regarding the component are automatically displayed in the process 15-2, and one mounting process among these can be selected and inputted in the process 15-3. If the mounting process is selected, the insertable directions in the mounting process are automatically displayed in the process 15-4, and one mounting direction among these is selected and inputted in the process 15-5. Thus the mounting process and the mounting direction are selected, and when the component is mounted from the mounting process and the mounting direction, whether a collision is produced or not is determined and the collision is calculated between the components and the jig positioned at its circumference in the process 15-6. The calculation result is displayed as the frame of "collision state indication" (the collision state is displayed as two surfaces, a side surface and a plane surface) in the process 15-7. If a collision is produced, the classification of the collision is also displayed on the frame as the alarm message. In the alarm message, in addition to the classification of the collision, the part symbol of the component relating to the collision is also displayed. For example, in FIG. 14, components relating to the collision are indicated as a table to the left side of the frame, and these components are indicated as a side view and a plan view to the right side of the frame. The details of the collision state can be discerned from such an indication.

When a collision is detected, its degree varies. The automatic mounting may be possible depending on the degree of the collision. For example, when degree of collision is slight and a component is bent a little so that the automatic mounting can be performed without hindrance, even if mounting of a component by manual process is automatically determined judging from the collision state indication, the measure of returning the component to the automatic process may be taken if the degree of the collision is slight. Since the part shape may be limited to a combination of simple geometric shapes to some degree when calculating the collision, the part shape is slightly different from the actual part shape. Therefore, even if a component is judged relating to the collision in calculating the collision, the collision may not be actually produced or the degree of the collision may be slight with the actual components. Therefore, in this case, the mounting process automatically determined previously can be modified. To enable the correction, however, the collision state of the component relating to the manual process must be displayed as a frame of "collision state indication", and as the premise of the indication, the component relating to the manual process must be known.

FIG. 16 illustrates an example of a frame of "table of process changing components" regarding components where the mounting process is changed from the automatic process to the manual process. As shown in FIG. 16, the components changed to the manual process (corresponding to "5" as the process number) are displayed together with the part symbol. Consequently, if any among these components is arbitrarily selected and key-inputted, the processing is subsequently transferred to the process 15-1 shown in FIG. 15. As a result, the details of the collision state regarding the component can be known.

Figure 17:
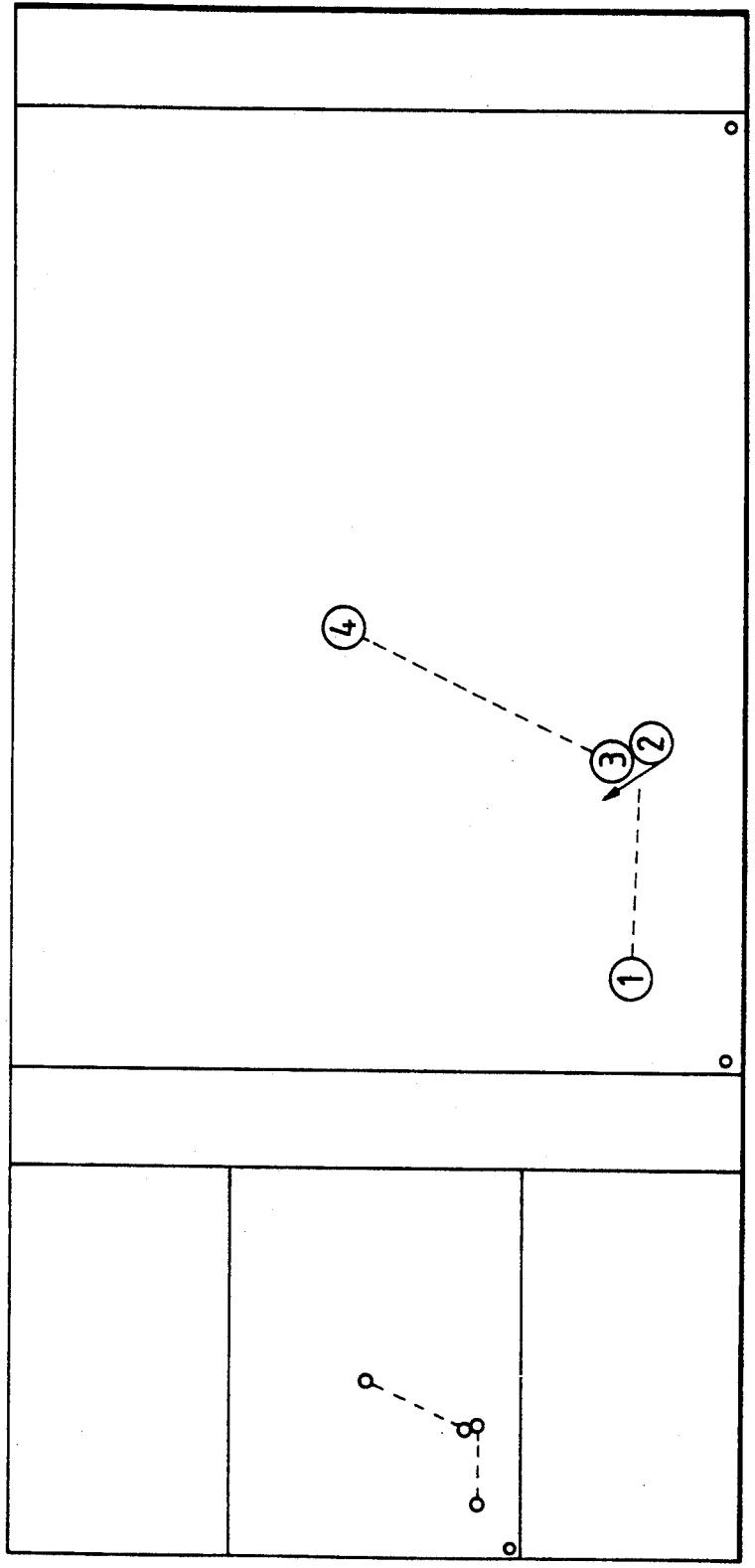
FIG. 17 is a diagram showing an example of a frame of "mounting sequence indication"

FIG. 17 illustrates an example of a frame of "mounting sequence indication". If any of the plural mounting processes is arbitrarily selected and key-inputted, all components mounted in the mounting process are displayed as plane state and in the connected state by broken lines in the mounting order. Here, the components are indicated as combination of circles and rectangles based on the shape data, and the limitation of the mounting sequence is simultaneously indicated. The limitation is indicated as arrow (solid line indication) connecting between components, and whether the correction of the mounting sequence is possible or not is determined from the limitation indication, and the mounting sequence is modified if necessary. Here, the limitation of the mounting sequence is disclosed in detail in U.S. Pat. No. 4,706,187. More specifically, the component to be modified by the cursor is commanded, or the part symbol is key-inputted, and the component with the mounting sequence to be modified is selected. Further a component to be mounted before or after the component is selected from the frame either by the cursor or by the part symbol being key-inputted. If a collision is produced by the correction, the alarm message is displayed.

Figure 18:
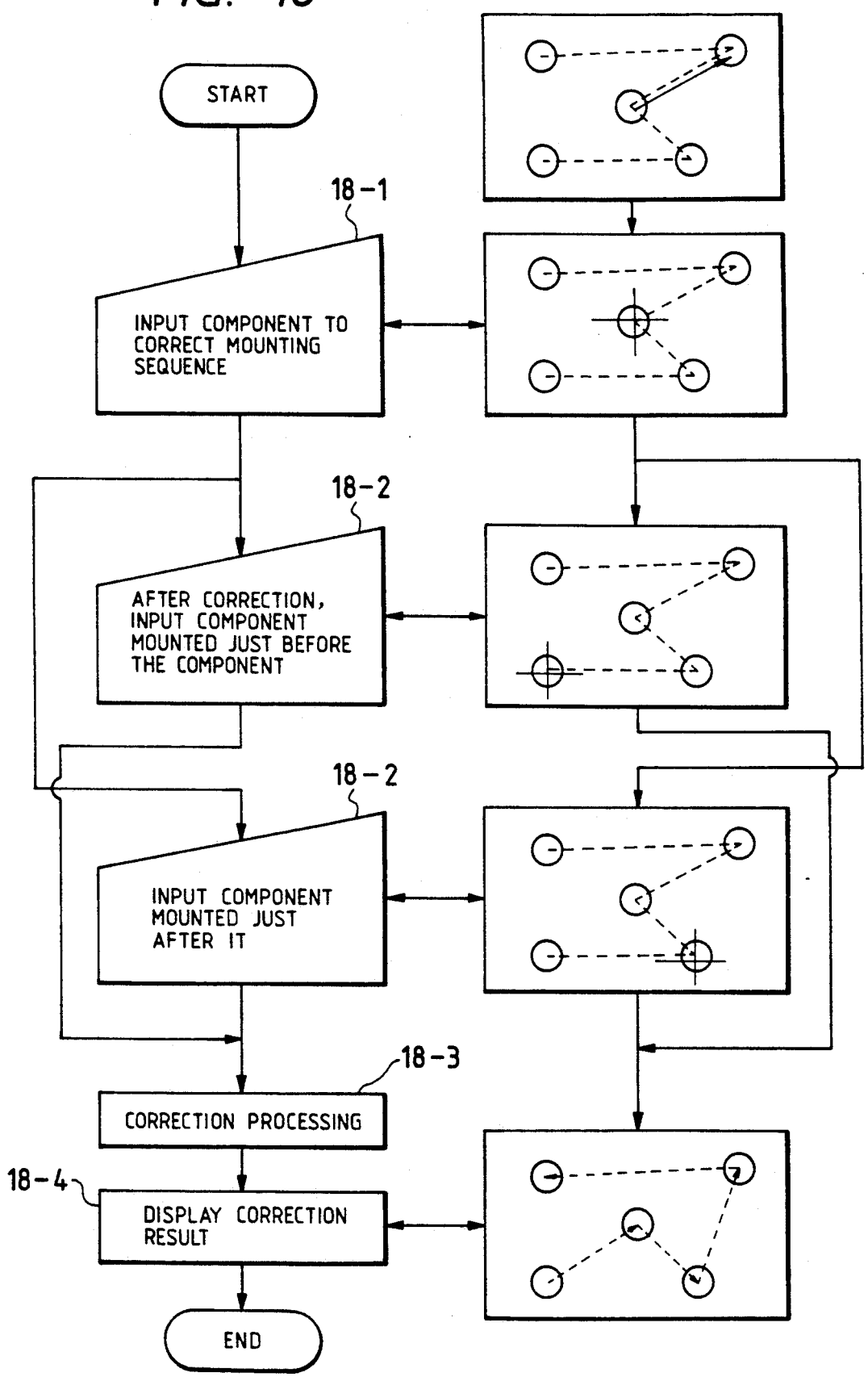
FIG. 18 is a diagram illustrating a flow in processing of correcting the mounting sequence corresponding to the display frame.

FIG. 18 shows a flow in the modifying process corresponding to the display frame. Referring to FIG. 18, first, the component relating to the correction of the mounting sequence is assigned and selected by the cursor (indicated as + symbol) in the process 18-1. A component to be mounted before or after the selected component is then assigned and selected by the cursor in the process 18-2 (in this example, a component to be mounted just before the component selected in the process 18-1 is selected). Thus the component is selected, and then the process of correcting the mounting sequence is performed in the process 18-3, and the correction result is displayed on the frame in the process 18-4.

Finally, the process for generating the numerical control data for mounters will be described. In this process, numerical control data for each mounter are generated based on the process for deciding the mounting process and the mounting sequence automatically, and the mounting process and the mounting sequence regarding each component determined by the interactive correction processing, and further information such as numerical control data format proper for each mounter. However, a detailed description of this process is not provided.

The apparatus for preparing numerical control data for interactive mounters according to the present invention has been described. As clearly understood from the description, data of the insertion head, the components and the mounting condition are inputted to the display frame, the numerical control data for mounters can be easily generated interactively referring to the collision state indication.

As described above, according to the present invention, inputting or correcting the shape data of the insertion head, jig and components is facilitated, and the mounting process, the mounting sequence and the collision state thus determined can be easily displayed. Further changing the arrangement order of the mounters due to changing lines can be easily dealt with. The shape data of the insertion head and the components can be simply inputted, and determining whether the inputted data is good or not is simplified. Calculating the component relating to the collision and various sorts of the treatment for the component are facilitated, and determining whether the determined mounting process is good or not is simplified. Correcting the determined mounting process is facilitated as determining whether the determined mounting sequence is good or not. Lastly, the apparatus for preparing numerical control data is interactive mounters is obtained where the correction of the determined mounting sequence is facilitated.

What is claimed is:

1. An apparatus for preparing numerical control data for a mounter having at least one insertion head to mount components on a board held by a jig, said apparatus comprising:
   a) a storage device,
   b) an input device, said input device adapted to
      i) permit input of
         A) board information data,
         B) component data,
         C) insertion head data, and
         D) jig data
         to said storage device, and
      ii) permit updating of
         A) the board information data,
         B) the component data,
         C) the insertion head data, and
         D) jig data,
         stored in said storage device;
   c) a display device, said display device adapted to
      i) graphically depict
         A) a shape of each of said components,
         B) a shape of said at least one insertion head,
         C) a shape of said board, and
         D) a shape of said jig, and
      ii) graphically indicate
         A) mounting positions of said components on said board,
         B) at least one process of mounting said components and an associated mounting sequence stored in said storage device, and
         C) any collision states between said components, between one of said components and said at least one insertion head, or between one of said components and said jig;
   d) a processor, said processor adapted to
      i) provisionally determine said at least one process of mounting said components onto said board and said associated mounting sequence, based on said board information data and said component data stored in said storage device,
      ii) store said data provisionally determined in step (d)(i) in said storage device,
      iii) determine whether any collision states exist between said components, between one of said components and said at least one insertion head, or between one of said components and said jig, and
      iv) update said mounting positions of said components, update said at least one process of mounting said components and said associated mounting sequence and replace corresponding data in said storage device, when any collision state exists; and
   e) a compilation device, said compilation device adapted to determine said numerical control data based on data stored in said storage device.

2. The apparatus of claim 1 wherein said insertion head data includes a set of head shape data with an associated registration number.

3. The apparatus of claim 2 wherein said head shape data defines at least one simple geometric shape.

4. The apparatus of claim 1 wherein said display device is adapted to graphically depict said at least one insertion head as a plane surface.

5. The apparatus of claim 1 wherein said display device is adapted to graphically depict said at least one insertion head as a side surface.

6. The apparatus of claim 1 wherein said component data includes a shape type, a set of parameters which define the size of the shape type, and an associated part registration number.

7. The apparatus of claim 6 wherein said component data further includes polarity data and wire diameter data.

8. The apparatus of claim 1 wherein said display device is adapted to graphically depict each of said components as a plane surface, a front surface, and a side surface.

9. The apparatus of claim 1 wherein said input device is further adapted to permit manual modification of at least one of said mounting position, said at least one said mounting process, and said associated mounting sequence, when said processor determines that a collision state exists.

10. The apparatus of claim 1 wherein said display device graphically indicates said mounting positions of said components and said mounting sequence associated with said at least one mounting process by displaying said board as a planar surface, displaying said components as circles and rectangles, and coloring each displayed component based on which of said at least one mounting process it belongs.

11. The apparatus of claim 1 wherein said display device graphically indicates said mounting sequence associated with said at least one mounting process by graphically depicting components as circles and rectangles and by graphically depicting the travel path of said at least one mounting head as a series of dashed lines between said displayed components.

12. In an apparatus including a storage device, an input device, a display device, a processor, and a compilation device, a method for preparing numerical control data for a mounter having at least one insertion head to mount components on a board held by a jig including steps of:
   a) inputing board information data, component data, insertion head data, and jig data into said storage device;
   b) checking data input in step (a) referring to graphical representatives of said data on said display device;
   c) selectively correcting and updating data input in step (a);
   d) substituting any data corrected or updated in step (c) for corresponding data in said storage device;
   e) automatically determining at least one mounting process and an associated mounting sequence for mounting said components onto said board based on data stored in said storage device;
   f) determining whether collision states exist between said components, between one of said components and said at least one insertion head, or between one of said components and said jig;

g) updating said at least one mounting process and said associated mounting sequence where necessary to avoid any collision states determined to exist in step (f); and h) generating said numerical control data.

13. The method of claim 12 wherein said steps of inputing, of checking, and of selectively correcting and updating data comprise sub-steps of:

i) accepting an insertion head number from said input device;

ii) determining whether the insertion head number has been registered;

iii) when the insertion head has been determined to have been registered, graphically depicting a shape of the insertion head on said display device;

iv) accepting, from said input device, an input for determining whether the shape of the insertion head should be modified;

v) determining whether the shape of the insertion head should be modified based on the input accepted in sub-step (iv);

vi) when it has been determined to modify the shape of the insertion head

A) accept modifying the data, from said input device, for modifying the shape of the insertion head, B) display the modified shape of the insertion head on said display device, C) accept determining the data, from said input device, for determining whether to further modify the shape of the insertion head, and D) when it has been determined to further modify the shape of the insertion head based on the data accepted in step (vi)(C), repeat sub-steps (vi)(A) through (vi)(D);

vii) accepting display completion completion data, from said input device, for determining whether display is completed; and viii) when it has been determined that display is not complete based on the data accepted in sub-step (vii), repeating sub-steps (i) through (viii).

14. The method of claim 12 wherein said steps of inputing, of checking, and of selectively correcting and updating data comprise sub-steps of:

i) accepting a component number from said input device;

ii) determining whether the component number has been registered;

iii) when the component number has been determined to have been registered, graphically depicting a shape of the component on said display device;

iv) accepting, from said input device, an input for determining whether the shape of the component should be modified;

v) determining whether the shape of the component should be modified based on the input accepted in sub-step (iv);

vi) when it has been determined to modify the shape of the component

A) accept modifying data, from said input device, for modifying the shape of the component, B) display the modified shape of the component on said display device, C) accept determining data, from said input device, for determining whether to further modify the shape of the component, and D) when it has been determined to further modify the shape of the component number based on the data accepted in step (vi)(C), repeat sub-steps (vi)(A) through (vi)(D);

vii) accepting display completion data, from said input device, for determining whether display is completed; and viii) when it has been determined that display is not complete based on the data accepted in sub-step (vii), repeating sub-steps (i) through (viii).

15. The method of claim 12 further comprising steps of:

determining whether it is desired for said at least one mounting process to be manually modified; and when it has been determined that said at least one mounting process is to be manually modified, permitting said at least one mounting process to be manually modified.

16. The method of claim 15 wherein said steps of determining whether it is desired for said at least one mounting process to be manually modified and of permitting said at least one mounting process to be manually modified includes sub-steps of:

i) displaying a graphic depiction of said at least one mounting process, including a graphic depiction of each of said components, on said display device;

ii) selecting, via said input device, one of said components graphically depicted on said display device;

iii) redefining, via said input device, a component type of said selected component;

iv) defining and displaying a graphic depiction of a plurality of possible mounting processes on said display device;

v) selecting, via said input device, one of said plurality of mounting processes;

vi) defining and displaying a graphic depiction of a plurality of possible mounting directions on said display device;

vii) selecting, via said input device, one of said plurality of mounting directions;

viii) determining whether a collision state exists between any of said components, between one of said components and said at least one mounting head or between one of said components and said jig; and ix) when a collision exists, graphically depicting said collision on said display device.

17. The method of claim 12 further comprising steps of:

determining whether it is desired for said mounting sequence associated with said at least one mounting process to be manually modified; and when it has been determined that said mounting sequence is to be manually modified, permitting said mounting sequence to be manually modified.

18. The method of claim 17 wherein said steps of determining whether it is desired for said mounting sequence to be manually modified and of permitting said mounting sequence to be manually modified includes sub-steps of:

i) display a graphic depiction of said mounting sequence, including a graphic depiction of each of said components and a graphic depiction of a travel path of said mounting head, on said display device;

ii) selecting, via said input device, a first component related to a desired correction of said mounting sequence;

iii) selecting, via said input device, a second component to be mounted immediately before said first component selected in sub-step (ii);

iv) redefining said mounting sequence based on said selection of said first component in sub-step (ii) and said selection of said second component in sub-step (iii); and v) displaying the mounting sequence redefined in sub-step (iv).

19. The method of claim 17 wherein said steps of determining whether it is desired for said mounting sequence to be manually modified and of permitting said mounting sequence to be manually modified includes sub-steps of:

i) displaying a graphic depiction of said mounting sequence, including a graphic depiction of each of said components and a graphic depiction of a travel path of said mounting head, on said display device;

ii) selecting, via said input device, a first component related to a desired correction of said mounting sequence;

iii) selecting, via said input device, a second component to be mounted immediately after said first component selected in sub-step (ii);

iv) redefining said mounting sequence based on said selection of said first component in sub-step (ii) and said selection of said second component in sub-step (iii); and v) displaying the mounting sequence redefined in sub-step (iv).

20. The method of claim 17 wherein said steps of determining whether it is desired for said mounting sequence to be manually modified and of permitting said mounting sequence to be manually modified includes sub-steps of:

i) displaying a graphic depiction of said mounting sequence, including a graphic depiction of each of said components and a graphic depiction of a travel path of said mounting head, on said display device;

ii) selecting, via said input device, a first component related to a desired correction of said mounting sequence;

iii) selecting, via said input device, a second component to be mounted immediately before said first component selected in sub-step (ii);

iv) selecting, via said input device, a third component to be mounted immediately after said first component selected in sub-step (ii);

v) redefining said mounting sequence based on said selection of said first component in sub-step (ii), said selection of said second component in sub-step (iii), and said selection of said third component in sub-step (iv); and vi) displaying the mounting sequence redefined in sub-step (v).

* * * * *

UNITED STATES PATENT AND TRADEMARK OFFICE
CERTIFICATE OF CORRECTION

PATENT NO. : 5,266,877
DATED : Nov. 30, 1993
INVENTOR(S) : Shino Takahashi, et al It is certified that error appears in the above-indentified patent and that said Letters Patent is hereby corrected as shown below:

| Column | Line | |
|--------|------|---|
| 5 | 63 | Change "veen" to --been--. |
| 11 | 8 | After "data" change "is" to --for--. |
| 11 | 28 | Before "jig" insert --the--. |
| 12 | 55 | Change "representatives" to --representations--. |
| 13 | 36 | Delete "completion" (second occurrence). |
| 14 | 58 | Change "display" to --displaying--. |

Signed and Sealed this

Twenty-sixth Day of July, 1994

Attest:

BRUCE LEHMAN

Attesting Officer          Commissioner of Patents and Trademarks